United States Patent
Wang

(10) Patent No.: US 7,466,614 B2
(45) Date of Patent: *Dec. 16, 2008

(54) SENSE AMPLIFIER FOR NON-VOLATILE MEMORY

(75) Inventor: Chin-Huang Wang, Pingjhen (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/546,122

(22) Filed: Oct. 10, 2006

(65) Prior Publication Data

US 2008/0084758 A1    Apr. 10, 2008

(51) Int. Cl.
*G11C 11/00* (2006.01)

(52) U.S. Cl. ...................... 365/205; 365/196

(58) Field of Classification Search .......... 365/205, 365/196
See application file for complete search history.

(56) References Cited

U.S. PATENT DOCUMENTS

| | | | | | |
|---|---|---|---|---|---|
| 5,400,285 | A | * | 3/1995 | Sakata | 365/205 |
| 5,841,719 | A | * | 11/1998 | Hirata | 365/189.15 |
| 6,097,634 | A | * | 8/2000 | Sugiyama | 365/185.21 |
| 6,411,559 | B1 | * | 6/2002 | Yokozeki | 365/205 |
| 6,418,064 | B1 | * | 7/2002 | Park | 365/189.05 |
| 7,057,957 | B2 | | 6/2006 | Wang | 365/207 |
| 2003/0007404 | A1 | * | 1/2003 | Yamauchi | 365/205 |
| 2004/0037140 | A1 | * | 2/2004 | Kang | 365/205 |
| 2004/0047215 | A1 | * | 3/2004 | Kim et al. | 365/205 |
| 2004/0213063 | A1 | * | 10/2004 | Park | 365/205 |
| 2004/0264276 | A1 | * | 12/2004 | Asano et al. | 365/205 |
| 2005/0152196 | A1 | * | 7/2005 | Kim | 365/205 |
| 2006/0056252 | A1 | * | 3/2006 | Park et al. | 365/205 |
| 2007/0115742 | A1 | * | 5/2007 | Vali et al. | 365/205 |
| 2007/0223272 | A1 | * | 9/2007 | Ohsawa | 365/184 |

FOREIGN PATENT DOCUMENTS

JP        63276792 A   * 11/1988

\* cited by examiner

*Primary Examiner*—Michael T Tran
(74) *Attorney, Agent, or Firm*—K & L Gates LLP

(57) ABSTRACT

A sense amplifier comprising a sense output circuit for providing a sense output signal and a logical inverse of the sense output signal based on a sense signal of a memory circuit, a charge control circuit for providing a precharge signal based on the output of the sense output circuit and a sense enable signal, a latch control circuit for providing control of a latch circuit based on the sense signal, the precharge signal and the logical inverse of the sense output signal, wherein when the sense signal is read, the latch control circuit provides one or more predetermined signals to the latch circuit to latch the sense signal to a logical level.

16 Claims, 3 Drawing Sheets

US 7,466,614 B2

SENSE AMPLIFIER FOR NON-VOLATILE MEMORY

BACKGROUND

The present invention generally relates to power consumption in memory circuits. More particularly, this invention presents a circuit and a method for memory sense amplifiers, which automatically limits the total power consumed by a sense amplifier.

A typical memory integrated circuit device such as a flash memory, contains several functional blocks which make up the whole memory system. For example, there is an address decode which takes the memory address bus as input and output word lines which select groups of memory cells for writing and reading. In addition, there are input data drivers which interface with the memory array data bit lines for purposes of writing new data into the memory cells. Then, there are the memory arrays themselves which are made up of memory cells. Sense amplifiers facilitate readings of data stored in the memory cells. The sense amplifiers sense the data level of bit-lines in order to sense (or read) the value of memory cells. The sense amplifiers interface with bit-lines, which are attached to the memory cells and with data output drivers (sense outputs), which are the output lines of the memory system.

During read operations, sense amplifiers are one of the circuit blocks that consume the most power. Pre-charging the bit-lines after reading also consumes a large amount of power, and the pre-charging circuits are often designed in conjunction with the sense amplifiers. Pre-charging is a way to restore bit-lines to an optimal operating region of the sense amplifiers, so that the memory cells can be read faster.

With greater memory density and increased commercial need, the power dissipation and speed of sense amplifiers are an important design criteria. Also, since any improvement to power consumed by sense amplifiers is magnified by the amount of memory, improvements to a sense amplifier design have a large impact in overall device performance. As such, there is a need for improved power performance in sense amplifier designs.

SUMMARY

The present disclosure provides for a sense amplifier comprising a sense output circuit for providing a sense output signal and a logical inverse of the sense output signal based on a sense signal of a memory circuit, a charge control circuit for providing a precharge signal based on the output of the sense output circuit and a sense enable signal, a latch control circuit for providing control of a latch circuit based on the sense signal, the precharge signal and the logical inverse of the sense output signal, wherein when the sense signal is read, the latch control circuit provides one or more predetermined signals to the latch circuit to latch the sense signal to a logical level.

The construction and method of operation of the invention, however, together with additional objectives and advantages thereof will be best understood from the following description of specific embodiments when read in connection with the accompanying drawings.

DESCRIPTION

Figure 1:
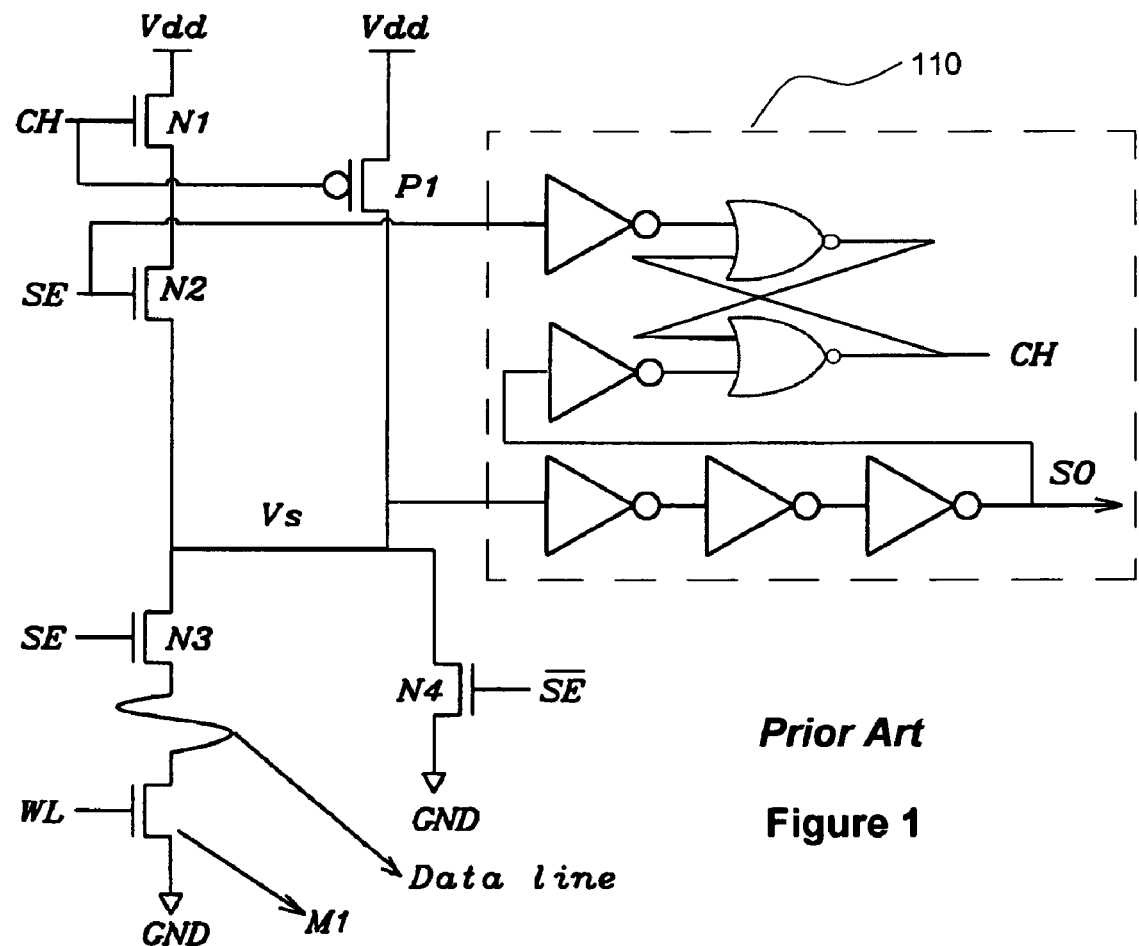
FIG. 1 illustrates a conventional sense amplifier design.

Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 shows a prior art memory sense circuit with precharging. Transistors N1, N2 form the data line precharge circuit such that when enabled, a precharge voltage Vs is established. The voltage Vs acts to accelerate the reading time of memory cell M1. Transistors N3 and N4 form part of a sense enable circuit so the state of M1 can be sensed on Vs. The sense enable signal SE is generated by external circuitry to control the memory read cycle. Transistor P1 provides a current source into the sense enable circuit. Voltage Vs is connected to the input of a sense output circuit 110.

The sense output circuit 110 generates a charge control signal (CH) that is coupled to the input of the precharging circuit and reference current source to disable the data line precharge circuit and reference current right after the data is sensed by the sense output circuit. Quick and automatic disabling of the data line precharge circuit achieves higher speed and lower power consumption than many other sense circuits available.

Figure 2:
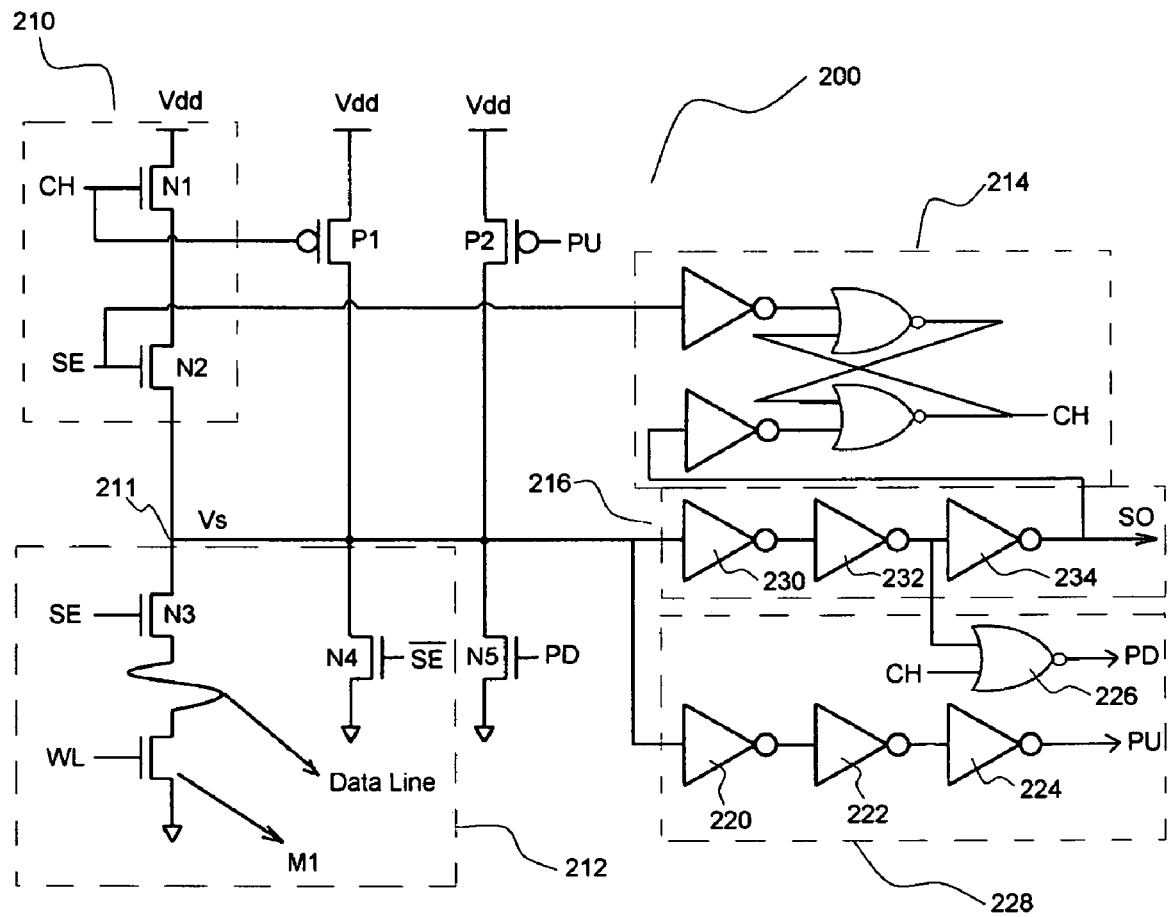
FIG. 2 illustrates one embodiment of the current invention.

FIG. 2 shows one embodiment of the current invention 200. In this embodiment transistors N1, N2 and P1 form a data line precharge and current source circuit 210. The output of the data line precharge and current source circuit 210 is connected to a sense node 211 and when enabled, the data line precharge circuit establishes a precharge voltage at sense node 211 (Vs). The precharge voltage at sense node 211 acts to accelerate the reading time of the memory sense circuit 212.

PMOS device P2 is connected between Vs and a positive voltage supply (Vdd) such that the source of P2 is connected to Vdd, and the drain of P2 is connected to sense node 211. The gate of P2 is connected to a Pull-up (PU) signal generated by a latch control circuit 228. NMOS device N5 is connected between Vs and the GND such that the drain is connected to node 211, the source is connected to the GND, and the gate is connected to a Pull-down (PD) signal generated by the latch control circuit 228.

In this embodiment, PMOS device P2 is a pull-up transistor and NMOS device N5 is a pull-down transistor and together they act to latch the voltage at sense node 211 to a full logical voltage of the circuit. The latch control circuit 228 has Vs as its input and generates two signals, pull-up (PU) and pull-down (PD). Sense node 211 is connected to the input of a first inverter 230. The output of the first inverter 230 is connected to a second inverter 232. The output of the second inverter 220 is connected to the input of a third inverter 234. The output of the third inverter 224 is the signal SO and the input to the third inverter is the logical inverse of SO.

The pull-up (PU) and pull-down (PD) signals connected to the gates of transistor P2 and N5 respectively, amplify and hold the signal at sense node 211 (Vs) latching it to a logic level, which improves the sense amplifier's ability to automatically set the precharge pulse width, shut down the reference current and more quickly terminate read operations.

In normal operation, before the sense enable SE signal goes high, the Vs signal is low and the CH signal is high. When SE goes high, Vs is precharged through devices N1 and N2. The charge control circuit 214 causes the CH signal to go low right after Vs goes higher than the trip point of inverter 230. The high level of Vs is maintained via current source P1. If the current through memory cell M1 is larger than the current through device P1, the sense output SO is high to cause a read signal of a '1'. If the current through memory cell M1 is less than the current through device P1, the sense output, SO is low.

To read a '1' from a memory cell, the circuit operates by starting with the precharge signal CH set to a logical high to allow for reading. Signal SO, which initially follows and is the inverse of the Vs signal, goes low when the Vs signal is precharged. When a word line (WL) signal in the memory cell is active simultaneous with the sense enable SE signal, the data line goes low if a '1' is stored in the memory cell. When the data line goes low, the Vs signal at sense node 211 goes low. This causes SO to go high. This completes the reading of a '1' from the memory onto the sense output SO. The precharge signal CH is set to a logical low as a function of the charge control circuit 214. This allows the precharge circuit and current source to be turned off automatically.

Figure 3:
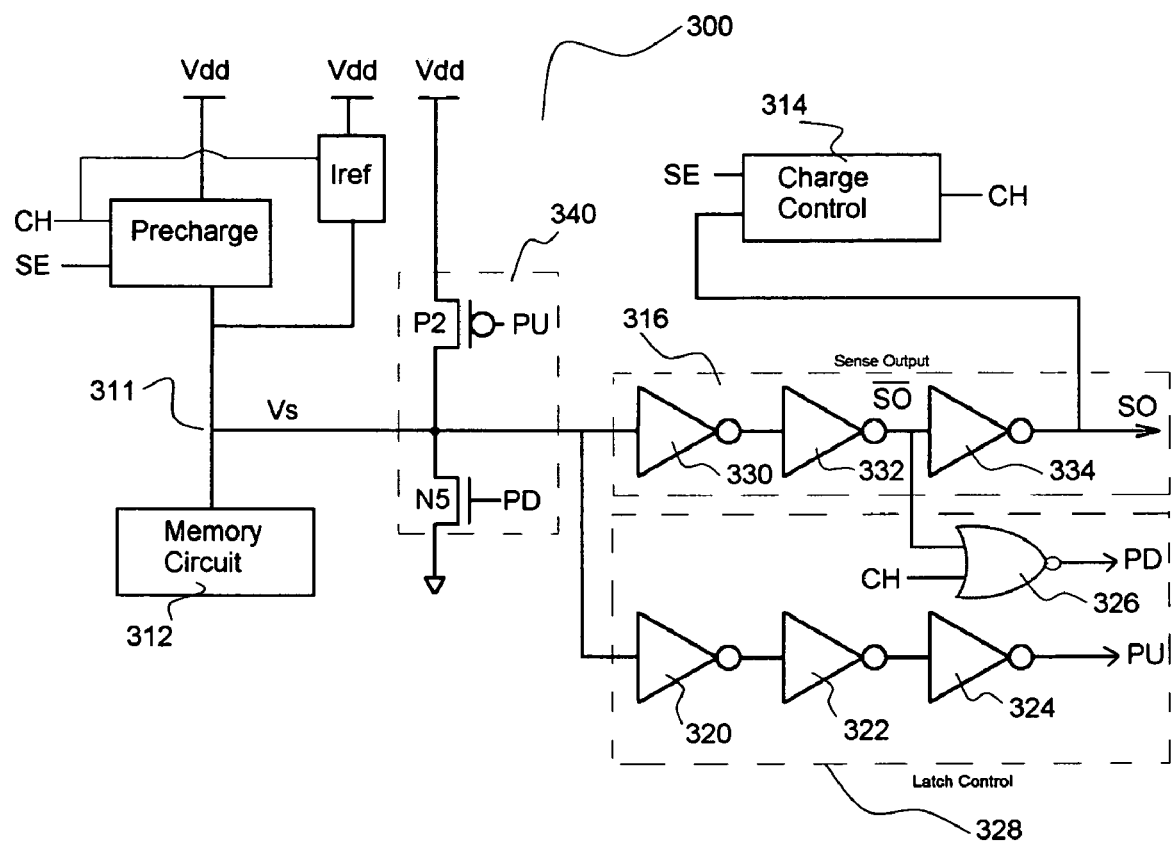
FIG. 3 shows a generic diagram of the current invention.

FIG. 3 shows a generic diagram of the current invention. The latch control circuit 328 provides feedback to the sense node 311 through the latch circuit comprised of PMOS device P2 and NMOS device N5. Depending on the value read from the memory cell either P2 will be on to pull Vs high, or N5 will be on to pull Vs low. The latch control circuit 328 receives the signal Vs into a first inverter 330. The output of the first inverter 330 is connected to the input of a second inverter 332. The output of the second inverter 332 is connected to a third inverter 334 and a first NOR gate 326. The output of the third inverter 334 is the signal SO, which is connected to the input of the charge control circuit 314. The first NOR gate 326 also receives a signal CH from the charge control circuit. The output of the first NOR gate 326 is the signal PD which is connected to the gate of the NMOS device N5.

The latch control circuit 328 also receives the signal Vs into a fourth inverter 320. The output of the fourth inverter 320 is connected to the input of a fifth inverter 322 whose output is connected to yet a sixth inverter 324. The output of the sixth inverter 324 is signal PU which is connected to the gate of the PMOS device P2.

This feedback from either pull-up transistor P2 or pull-down transistor N5 amplifies the signal at sense node 311 (Vs) latching it to a logic level which improves the sense amplifier's ability to automatically set the precharge pulse width and to terminate read operations faster.

One having skill in the art would recognize that for ideal operation inverter 330 and inverter 320 should be constructed with different threshold voltages such that they would trip at different values of Vs. For example, the trip voltage for inverter 320 would be higher than the trip voltage for inverter 330. One having ordinary skill in the art will also appreciate that by applying feedback in the manner of the present disclosure, the pre-charge circuit and current source can be disabled sooner and less power will be consumed by the sense amplifier. Also, by driving inverters 320-324 and 330-334 into their steady state quicker, the operating power of the circuitry will be reduced.

Also, one having skill in the art will recognize that the sense amplifier of the current disclosure generates its own control signals eliminating the need for external control signals.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A sense amplifier comprising:
   a sense output circuit for providing a sense output signal and a logical inverse of the sense output signal based on a sense signal of a memory circuit;
   a charge control circuit for providing a precharge signal based on the output of the sense output circuit and a sense enable signal; and
   a latch control circuit including a plurality of inverters and a NOR gate for selectively controlling a pull-up device and a pull-down device to maintain the sense signal at a predetermined voltage level in response to the sense signal, the precharge signal and the logical inverse of the sense output signal.

2. The sense amplifier of claim 1, wherein the sense output circuit comprises:
   a first inverter for receiving the sense signal; and
   a second inverter for controlling a third inverter based on an output of the first inverter,
   wherein an output of the third inverter is the sense output signal and an input to the third inverter is the logical inverse of the sense output signal.

3. The sense amplifier of claim 2, wherein the latch control circuit comprises:
   a fourth inverter for receiving the sense signal;
   a fifth inverter for controlling a sixth inverter based on the output of the fourth inverter; and
   a NOR gate for providing a first control signal to the latch circuit based on the logical inverse of the sense output signal and the precharge signal,
   wherein the output of the sixth inverter provides a second control signal to the latch circuit.

4. The sense amplifier of claim 3, wherein the threshold voltage of the fourth inverter is higher than the threshold voltage of the first inverter.

5. The sense amplifier of claim 4, wherein the latch circuit comprises a pull-up transistor and a pull-down transistor with the sense signal coupled to the drain ends thereof.

6. The sense amplifier of claim 1 further comprising:
   a precharge circuit for precharging the sense output circuit in response to the precharge signal and the sense enable signal.

7. The sense amplifier of claim 6, wherein the memory cell is a flash memory.

8. A sense amplifier comprising:
   a first inverter having an input connected to a sense node of a memory circuit;
   a second inverter whose input is connected to the output of the first inverter;
   a third inverter whose input is connected to the output of the second inverter and whose output is connected to a charge control circuit;
   a fourth inverter whose input is connected to the sense node;
   a fifth inverter whose input is connected to the output of the fourth inverter;

a sixth inverter whose input is connected to the output of the fifth inverter and whose output is connected to the gate of a PMOS device having its source connected to a positive supply voltage and its drain connected to the sense node; and a NOR gate having one input connected to the output of the second inverter, a second input connected to the output of a charge control circuit and an output connected to the gate of an NMOS device whose drain is connected to the sense line and whose source is connected to a negative supply (GND).

9. The sense amplifier of claim 8, wherein the threshold voltage for the fourth inverter is higher than the threshold voltage for the first inverter.

10. The sense amplifier of claim 9, wherein the memory cell is a flash memory.

11. A method for sensing the value of a memory cell comprising:

receiving the sense signal from the memory cell;

combining the sense signal with a precharge signal to generate a pull-up signal and a pull-down signal;

applying the pull-up signal to a pull-up transistor connected between the sense signal and a positive supply voltage; and applying the pull-down signal to a pull-down transistor connected between the sense signal and a negative supply voltage, wherein when the sense signal changes during a memory read, feedback will be applied to the sense signal latching it to a logic level.

12. The method of claim 11, wherein:

the pull-up transistor is a PMOS device whose source is connected to the positive supply voltage, whose drain is connected to the sense signal and whose gate is connected to the pull-up signal;

the pull-down transistor is an NMOS device whose drain is connected to the sense line, whose source is connected to the negative supply and whose gate is connected to the pull-down signal.

13. The method of claim 11, wherein the step of receiving the sense signal further comprises:

receiving the sense signal into a first inverter; and receiving the sense signal into a second inverter, wherein the threshold voltage of the first inverter is lower than the threshold voltage of the second inverter.

14. The method of claim 13, wherein the pull-down signal is generated by applying the precharge signal to a first input of a NOR gate and applying the logical inverse of a sense output to a second input of a NOR gate, whereby the output of the NOR gate is the pull-down signal.

15. The method of claim 13, wherein the pull-up signal is generated by:

applying the output of the second inverter to the input of a third inverter; and applying the output of the third inverter to yet a fourth inverter, wherein the output of the fourth inverter is the pull-up signal.

16. The method of claim 14, wherein the memory cell is a flash memory.

* * * * *